United States Patent [19]

Takase et al.

[11] 3,967,294
[45] June 29, 1976

[54] PNPN SEMICONDUCTOR DEVICE

[75] Inventors: Yahei Takase; Akira Kawakami, both of Itami, Japan

[73] Assignee: Mitsubishi Denki Kabushiki Kaisha, Japan

[22] Filed: Dec. 30, 1974

[21] Appl. No.: 537,423

[30] Foreign Application Priority Data

Jan. 7, 1974 Japan.................................. 49-5475

[52] U.S. Cl..................................... 357/38; 357/20; 357/39; 357/86
[51] Int. Cl.² ........................................ H01L 29/74
[58] Field of Search ..................... 357/38, 86, 20, 39

[56] References Cited
UNITED STATES PATENTS 3,794,890  2/1974  Weimann et al...................... 357/38
3,896,476  7/1975  Kawakami ............................ 357/38

OTHER PUBLICATIONS

I.E.E.E. Conference Record of IAS 1973 Eighth Annual Meeting, E. Wolley et al., "Characteristics of a 200 AMP Gate Turn–Off Thyristor," pp. 251–255, Oct. 11, 1973.

Primary Examiner—William L. Sikes
Assistant Examiner—Joseph E. Clawson, Jr.
Attorney, Agent, or Firm—Wenderoth, Lind & Ponack

[57]     ABSTRACT

In a PNPN semiconductor device comprising a cathode base layer, a cathode emitter layer and an auxiliary emitter layer disposed on one of its main faces, an auxiliary electrode is disposed on the cathode base layer adjacent to a cathode electrode and a diode is formed in the cathode base layer between a gate electrode and the auxiliary electrode. The diode includes one semiconductor layer formed of the adjacent portion of the cathode base layer, an electrode connected to the gate electrode and a PN junction forwardly biased with a reverse bias applied to the gate electrode.

8 Claims, 9 Drawing Figures ered to as a PNPN SEMICONDUCTOR DEVICE

BACKGROUND OF THE INVENTION

This invention relates to a PNPN semiconductor device high in both capability and operating frequency.

High capability thyristors previously used with inverter apparatus have had the operating frequency limited to 5 kilohertz. Recently there are being demanded thyristors having higher operating frequency, for example the frequency of 10 kilohertz. In order to increase the operating frequency of thyristors to 10 kilohertz or higher, those thyristors are required to have the following performance:

1. The turn-off time should be of 10 microseconds or less.
2. The switching loss should be low. More specifically, the entire region should be brought into the conducting state within a short time interval with a low voltage drop in the conducting state.

High frequency thyristors of the conventional construction have included the main thyristor section and the auxiliary thrysitor section and manufactured by doping the silicon substrate thereof with a heavy metal such as gold (Au) or the like in order to decrease the lifetime of carriers to shorten the turn-off time. In such thyristors it is well known that the application of the gate trigger pulse thereto causes first the conduction of the auxiliary thyristor section followed by the conduction of the main thyristor section. Thus those thyristors have exhibited a shorter time interval to conduct the entire region thereof as compared with conventional thyristors without the auxiliary thyristor section.

However, in the process of manufacturing the thyristors as above outlined, a decrease in lifetime of carriers due to the diffusion of a heavy metal has brought about an increase in voltage drop during the conduction on the one hand and an increase in leakage current making it difficult to provide the thyristors high in OFF-state voltage on the other hand. Therefore it has been difficult to simultaneously meet the requirements (1) and (2) as above described.

Also one of known methods of decreasing the turn-off time is to interrupt the principal current through high frequency thyristors by inverting a voltage across the anode and cathode electrodes thereof followed by the application of a reverse voltage across both electrodes whereby the turn-off time is materially decreased. Since that method can decrease the turn-off time without an decrease in lifetime of carriers, it is extremely advantageous in that high frequency thyristors meeting the requirements (1) and (2) as above described are manufactured. However it is required to apply a sufficient magnitude of a reverse voltage across the junction involved. As a result, even if the method as above described would be applied directly to the conventional structure of high frequency thyristors, then it is impossible to apply a sufficient magnitude of a reverse voltage across the junction leading to the unsatisfactory results.

SUMMARY OF THE INVENTION

Accordingly it is an object of the present invention to provide a new and improved PNPN semiconductor device the most effective for decreasing a turn-off time by applying a reverse voltage across the gate and cathode electrodes thereof.

It is another object of the present invention to provide a new and improved PNPN semiconductor device high in both capability and operating frequency while still decreasing in turn-off time.

By a PNPN semiconductor device comprising a PNPN semiconductor substrate having a pair of opposite main faces and including a cathode emitter layer and an auxiliary emitter layer identical in conductivity to each other, and disposed on one of said main faces and spaced away from each other, a cathode base layer disposed adjacent said cathode emitter layer on the one main face, and an anode emitter layer disposed on the other main face; and anode electrode disposed in ohmic contact with said anode emitter layer; a cathode electrode disposed in ohmic contact with said cathode emitter layer; an auxiliary emitter electrode disposed in ohmic contact with said auxiliary emitter layer; a gate electrode disposed in ohmic contact with that portion of said cathode base layer disposed on that side of said auxiliary emitter layer remote from said cathode emitter layer; at least one auxiliary electrode disposed in ohmic contact with said cathode base layer and spaced away from said cathode electrode; a semiconductor diode including one semiconductor layer disposed on that portion of said cathode base layer located between said cathode emitter layer and said auxiliary emitter layer and spaced away from said at least one auxiliary electrode; said one semiconductor layer being opposite in conductivity to said cathode base layer to form a PN junction therebetween; another electrode disposed in ohmic contact with said semiconductor layer; and means for electrically connecting said another electrode to said gate electrode.

The diode may be preferably located between the auxiliary electrode and the cathode electrode.

The diode may be also located between a pair of auxiliary electrodes disposed in ohmic contact with the cathode base layer.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
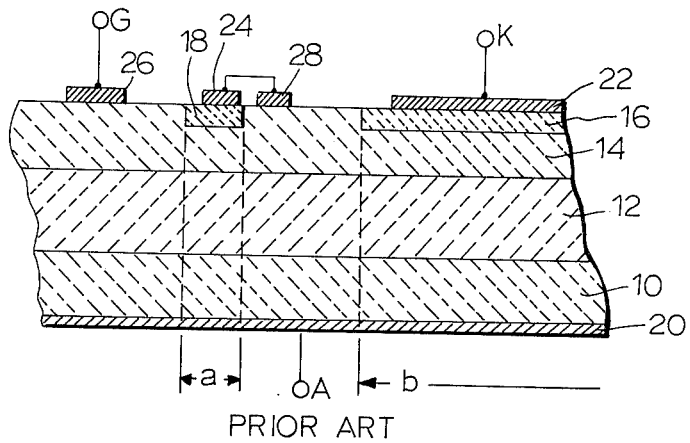
FIG. 1 a fragmental sectional view of a high frequency thyristor constructed in accordance with the principles of the prior art.

Referring now to the drawings and FIG. 1 in particular, there is illustrated a conventional high frequency thyristor. The arrangement illustrated comprises a wafer of semiconductive material including an anode emitter layer 10, an anode base layer 12, a cathode base layer 14 and a cathode emitter layer 16 of alternate conductivity superposed on one another in the named order to form a PNPN semiconductor substrate including PN junctions formed between the adjacent layers. The cathode emitter layer 16 is disposed in a predetermined portion of the cathode base layer 14 to be exposed to one of the main faces of the wafer and an auxiliary emitter layer 18 identical in conductivity to the cathode emitter layer 16 is disposed in another predetermined portion of the cathode base layer 14 to be spaced away from the cathode emitter layer 16 and also exposed to the one main face of the wafer.

Then an anode electrode 20 is disposed in ohmic contact with the anode emitter layer 10 and therefore with the other main face of the wafer and a cathode electrode 22 is disposed in ohmic contact with the cathode emitter layer 16 and therefore with the one main face of the wafer. An auxiliary emitter electrode 24 is disposed in ohmic contact with the auxiliary emitter layer 18, and a gate electrode 26 is disposed in ohmic contact with that portion of the cathode base layer 14 located on that side of the auxiliary emitter layer 18 remote from the cathode emitter layer 16. Further an auxiliary electrode 28 is disposed in ohmic contact with the cathode base layer 14 between the gate and cathode electrodes 24 and 22 respectively and electrically connected to the auxiliary emitter electrode 24.

The anode, cathode and gate electrodes 20, 22 and 26 respectively are connected to an anode, a cathode and a gate terminal A, K and G respectively.

The auxiliary emitter layer 18 and those portions of the layers 14, 12 and 10 located therebelow form an auxiliary thyristor section with the auxiliary emitter electrode 24 and that portion of the anode electrode 20 positioned below the electrode 24. The auxiliary thyristor section is labelled the reference character $a$. The remaining portion of the arrangement as shown in FIG. 1 form a main thyristor section labelled the reference numeral $b$.

It is well known that in the arrangement of FIG. 1, a gate trigger voltage is first applied to the gate electrode 26 to bring the auxiliary thyristor section $a$ into its conducting state and then the main thyristor section $b$ is brought into its conducting state whereby the entire structure as shown in FIG. 1 becomes conducting.

A time interval required for the entire structure of FIG. 1 to be put in its conducting state after a gate trigger voltage has been applied to the gate electrode is short as compared with thyristor without the auxiliary thyristor section as above described. Thus conventional high frequency thyristors have been generally manufactured into the structure as shown in FIG. 1.

Further in order to decrease the turn-off time, a heavy metal such as gold has been usually doped into wafers of semiconductive material to decrease the lifetime of carriers. This measure has caused an increase in voltage drop across the anode and cathode electrodes during the conduction due to a decrease in lifetime of carriers thereby to increase the switching loss on the one hand and an increase in leakage current on the other hand. This increase in leakage current makes it difficult to provide high frequency thyristors high in OFF-state voltage. Therefore it has been difficult to simultaneously meet the requirements (1) and (2) for increasing the operating frequency, for example, to 10 KHz or higher, as previously described. For example, it has been said to be impossible that the turn-off time of 10 microseconds or less is imparted to thyristors having the OFF-state voltage of 1,000 volts or higher.

Also it is well known to interrupt the principal current through thyristors by the inversion of the voltage across the anode and cathode electrodes thereof followed by the application of a reverse voltage across the gate and cathode electrodes thereof. This has resulted in the actual decrease in turn-off time. This measure has been extremely advantageous in that high frequency thyristors meeting the requirements (1) and (2) as previously described are manufactured because the turn-off time can be decreased without a decrease in lifetime of carriers.

Figure 2A:
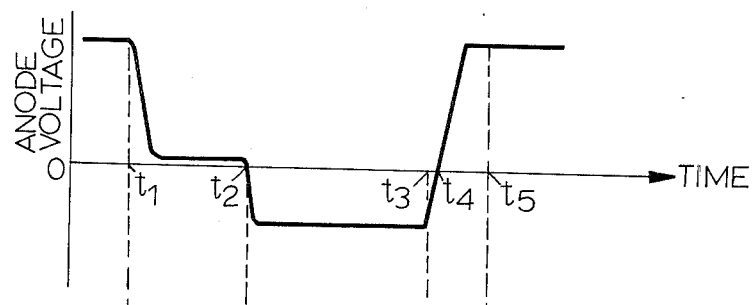
FIGS. 2a–2c are graphs illustrating waveforms of current and voltage developed at various point on the arrangement shown in FIG. 1 by using a method of applying a reverse voltage across the gate and cathode electrodes thereof.
Figure 2B:
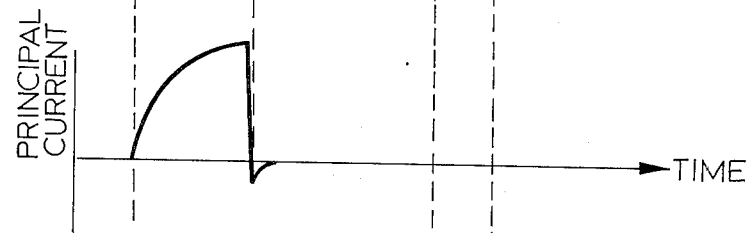
Figure 2C:
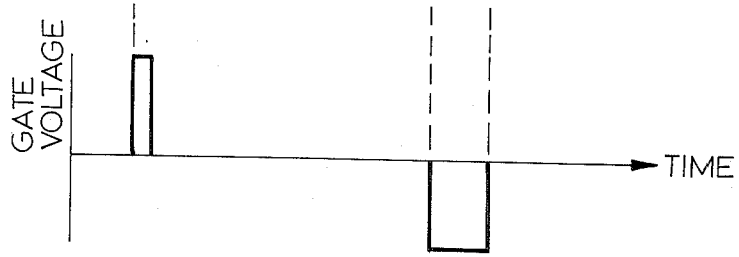

The measure will now be briefly described with reference to FIG. 2. A gate trigger voltage or pulse having a waveform ($c$) shown in FIG. 2 is applied to a gate electrode of a thyristor at time point $t_1$ to turn the thyristor on. Thus a principal current having a waveform ($b$) shown in FIG. 2 begins to flow through the thyristor while a voltage across the anode and cathode electrode of the thyristor varies as shown at waveform ($a$) in FIG. 2. At time point $t_2$, the voltage across the anode and cathode electrode is inverted to interrupt the principal current as shown in FIGS. 2$a$ and 2$b$.

After the interruption of the principal current, a reverse voltage having a waveform ($c$) going negative shown in FIG. 2$c$ is applied across the gate and cathode electrodes for a predetermined fixed time interval so as to include a time point where the forward voltage is initiated to be applied across the anode and cathode electrodes of the thyristor. In FIG. 2, the reverse voltage is shown as being applied to the gate electrode for a time interval between time point $t_3$ where the anode voltage is initiated to go toward the forward direction and time point $t_5$ where the anode voltage has already reached its predetermined positive magnitude. The anode voltage passes through its zero point at time point $t_4$ included within the time interval ($t_3 - t_5$).

It may be considered that, in order to cause conventional high frequency thyristors to meet the requirements (1) and (2) as previously described, the process as above described in conjunction with FIG. 2 will be applied to thyristors having the structure as shown in FIG. 1. The behavior of the thyristor structure as shown in FIG. 1 will now be described in conjunction with FIG. 3 particularly in terms of a time interval between time points $t_4$ and $t_5$.

Figure 3:
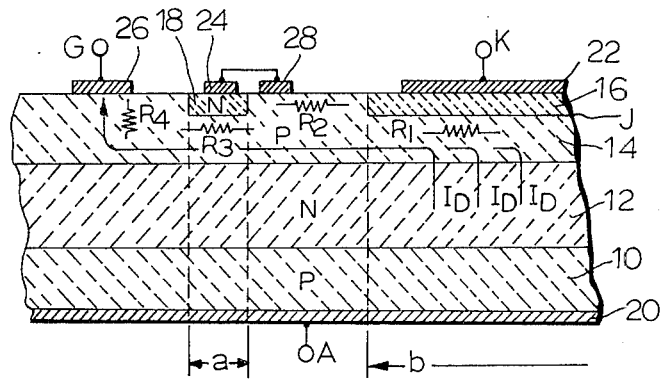
FIG. 3 is a replica of FIG. 1 useful in explaining the method of applying a reverse voltage across the gate and cathode electrodes of the arrangement shown in FIG. 1.

FIG. 3 is a replica of FIG. 1 having resistances and currents denoted therein. The arrangement illustrated includes the anode emitter layer 10 and the cathode base layer 14 shown as being of a P type conductivity and the anode base layer 12, the cathode emitter layer 16 and the auxiliary emitter layer 18 shown as being of an N type conductivity. It is assumed that the anode base layer 12 has flowing therethrough a current $I_D$ resulting from holes that are residual carriers.

In the absence of a reverse voltage applied across the gate and cathode electrodes 26 and 22 respectively to render the gate electrode 26 negative with respect to the cathode electrode 22, the holes within the anode base layer 12 are attracted by a forward voltage again applied across the anode and cathode electrodes 20 and 22 respectively at time point $t_4$ (see FIG. 2) which voltage renders the anode electrode 20 positive with respect to the cathode electrode 22. Therefore, one portion of the current $I_D$ flows across the junction J formed between the cathode base and emitter layers 14 and 16 respectively until it reaches the cathode electrode 22. This results in the injection of electrons from the cathode emitter layer 16 into the cathode base layers 14.

This injection of electrons is similar in the result to the application of a gate trigger voltage to the gate electrode 26 to bring the thyristor into its conducting state. Thus in spite of no gate trigger voltage being applied to the gate electrode after time point $t_4$, the thyristor may be conducting and is thus deprived of its ability to turn off. Therefore it will be appreciated that the turn-off time is strongly affected by the injection efficiency at the junction J.

However if the gate electrode is applied with a voltage less than that at the cathode electrode to apply a sufficient magnitude of a reverse voltage across the junction J then that voltage prevents the current $I_D$ from flowing through the junction J. Thus the current $I_D$ flows along the arrowed line shown in FIG. 3 until it is taken out from the gate electrode 26. Under these circumstances, a voltage drop is developed across a sheet resistance of that portion of the cathode base layer 14 located below the junction J and labelled $R_1$. If this voltage drop is higher than the reverse voltage applied across the junction J then a forward voltage is applied across one portion of the junction J. This causes electrons from the cathode emitter layer 16 to be injected into the cathode base layer 14. Therefore, notwithstanding the thyristor has no gate trigger voltage applied thereto, the same may be brought into its conducting state. In order to avoid this objection, it is necessary that the junction J should have a sufficient magnitude of a reverse voltage applied thereacross.

From the foregoing it can be concluded that, in order to decrease the turn-off time of thyristors by applying a reverse voltage across the gate and cathode electrodes thereof, a reverse voltage having a sufficiently high magnitude should be applied across the junction J.

In the conventional structure of high frequency thyristors as shown in FIGS. 1 and 3, however, only a small portion of a reverse voltage applied across the gate and cathode electrodes thereof is applied across the junction J therein. Therefore, the turn-off time is only somewhat decreased but the effect of the reverse voltage across the gate and cathode electrodes is not satisfactorily exhibited. This has been demonstrated by experimental data as will be described later. More specifically, if a reverse voltage is applied across the gate and cathode electrodes then the same is applied across the junction J between the cathode emitter and base layers 16 and 14 respectively and the sum of lateral resistances $R_2$, $R_3$ and $R_4$ of the cathode base layer 14 (see FIG. 3). Among these resistances, the resistance $R_3$ is determined by a sheet resistance of the deep portion of the cathode base layer and its magnitude is fairly high. This means that a fairly large proportion of the reverse voltage is applied across the resistance $R_3$. In the structure of FIG. 3, therefore, a reverse voltage can not be sufficiently applied across the junction J and hence the turn-off time can not been sufficiently decreased.

From the foregoing it can be said that means for applying a reverse voltage across the gate and cathode electrodes of thyristors to decrease the turn-off time is effective for high frequency thyristors but that the direct application of the reverse voltage to high frequency thyristors of the conventional structure does not lead to the application of the sufficient magnitude of reverse voltage across the junction J involved and therefore the satisfactory effect is not exhibited.

The present invention contemplates to provide the most effective structure of PNPN semiconductor devices for decreasing the turn-off time by applying a reverse voltage across the gate and cathode electrodes thereof while the remaining electric characterics are retained.

Figure 4:
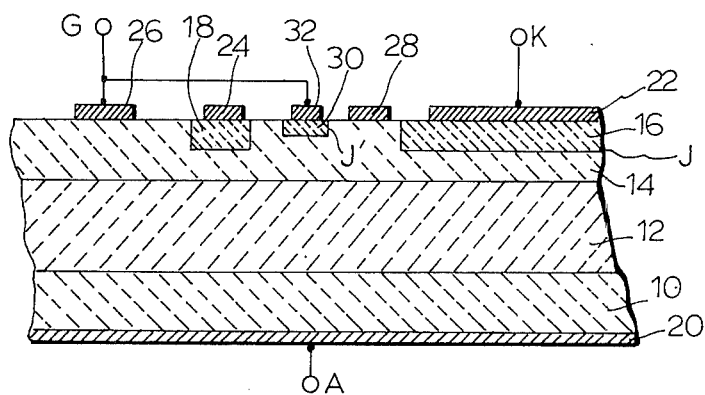
FIG. 4 is a fragmental sectional view of a high frequency thyristor constructed in accordance with the principles of the present invention.

Referring now to FIG. 4 wherein like reference numerals designate the components identical to those shown in FIGS. 1 or 3, there is illustrated a high frequency thyristor constructed in accordance with the principles of the present invention. The arrangement illustrated is different from that shown in FIGS. 1 or 3 only in that in FIG. 4, a semiconductor layer 30 opposite in conductivity to the cathode base layer 14 is disposed in the latter layer between the auxiliary emitter layer 18 and the cathode emitter layer 16 to form a semiconductor diode with the adjacent portion of the cathode base layer 14. The diode includes a PN junction J'. Then a diode electrode 32 is disposed in ohmic contact with the semiconductor layer 30 to be positioned between the gate and auxiliary electrodes 24 and 28 respectively. The gate electrode 26 is electrically connected to the diode electrode 32 but the auxiliary emitter electrode 24 is electrically isolated from the auxiliary electrode 28.

In the arrangement of FIG. 4, the application of a reverse voltage across the gate and cathode electrodes 26 and 22 respectively causes the junction J between the cathode base and emitter layers 14 and 16 respectively to be reversely biased while the junction J' between the semiconductor layer 30 and the cathode base layer 14 is forwardly biased. Thus almost all of the reverse voltage across the gate and cathode electrodes is applied across the junction J resulting in the turn-off time decreasing sufficiently.

Figure 5:
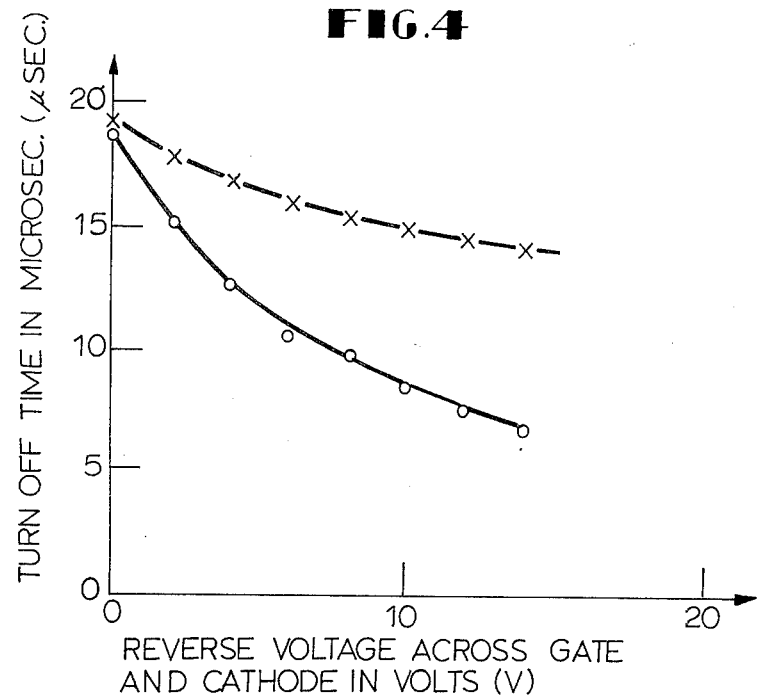
FIG. 5 is a view similar to FIG. 4 but illustrating a modification of the present invention.

Experiments were conducted with both test elements according to the present invention such as shown in FIG. 4 and those of the conventional structure as shown in FIGS. 1 or 3 by applying reverse voltage across the gate and cathode electrodes in order to measure the turn-off time thereof. The results of the experiments are shown in FIG. 5 wherein a turn-off time in microseconds is plotted in ordinate against a reverse voltage in volts across the gate and cathode electrodes in abscissa. In FIG. 5 measured values designated by the symbol "circle" describe the structure of the present invention and measured values designated by the symbol "cross" describes the conventional structure.

From FIG. 5 it is seen that the structure of the present invention is excellent in the effect of decreasing the turn-off time. For example, a reverse voltage of about 10 volts could be applied across the gate and cathode electrodes to halve the turn-off time. That is, the turn-off time was of 10 microseconds or less. Further, it has been experimentally proved that the same test elements have the ability to conduct sinusoidal half-wave currents having the peak magnitude of from 600 to 700 amperes at an operating frequency of 10 kilohertz.

From the foregoing it will be appreciated that, by adopting the structure as shown in FIG. 4, it has become possible to realize high frequency, high capability thyristors having the turn-off time of 10 microseconds or less and the operating frequency of 10 kilohertz or higher without the remaining electric characteristics impeded.

In order to form the diode as shown in FIG. 4 by utilizing that portion of the cathode base layer 14 located between the auxiliary emitter layer 18 and the cathode emitter layer 16, one may utilize any of the following measures: (1) the diffusion of an impurity such as phosphorous (P) or arsenic (As), (2) the epitaxial crystal growth, (3) the utilization of the Schottky junction (metal-seconductor junction) and (4) the alloying.

It has been found that diodes formed by any one of the measures as above described in accordance with the principles of the present invention exhibit the effect of decreasing the turn-off time as above described in conjunction with FIGS. 4 and 5.

Figure 6A:
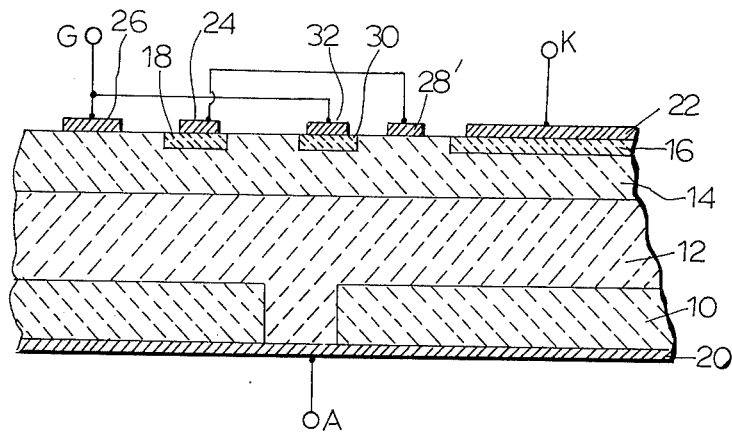
FIG. 6A is a view similar to FIG. 4 but illustrating another modification of the present invention.
Figure 7:
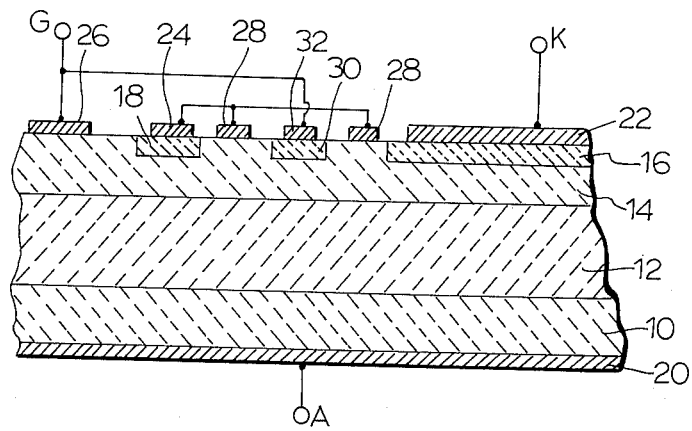
FIG. 7 is a view similar to FIG. 4 but illustrating still another modification of the present invention.

In FIGS. 6A and 7 wherein like reference numerals designate the components identical to those shown in FIG. 4, there are illustrated modifications of the present invention. In FIG. 6A, the diode is disposed in the cathode base layer 14 between the auxiliary emitter electrode 24 and the auxiliary electrode 28 interconnected. In FIG. 7 a pair of auxiliary electrodes 28 and 28' are disposed in ohmic contact with the cathode base layer 14 between the gate and cathode electrodes 24 and 22 respectively and the diode is disposed in the cathode base layer 14 between the auxiliary electrodes 28 and 28' connected together to the auxiliary emitter electrode 24. It has been found that the arrangements as shown in FIGS. 6A and 7 decrease sufficiently and effectively the turn-off time.

While the present invention has been illustrated and described in conjunction with a few preferred embodiments thereof it is to be understood that various changes and modifications may be resorted to without departing from the spirit and scope of the present invention. For example, instead of reverse blocking thyristors as above described, the present invention is equally applicable to those semiconductor devices having the anode emitter layer electrically connected to the surface of one portion of the anode base layer through the anode electrode and called "reverse conducting thyristors."

What we claim is:

1. A PNPN semiconductor device comprising a PNPN semiconductor substrate having a pair of opposite main faces and including a cathode emitter layer and an auxiliary emitter layer identical in conductivity to each other, and disposed on one of said main faces and spaced away from each other, a cathode base layer disposed adjacent said cathode emitter layer on the one main face, and an anode emitter layer disposed on the other main face; an anode electrode disposed in ohmic contact with said anode emitter layer; a cathode electrode disposed in ohmic contact with said cathode emitter layer; an auxiliary emitter electrode disposed in ohmic contact with said auxiliary emitter layer; a gate electrode disposed in ohmic contact with that portion of said cathode base layer disposed on that side of said auxiliary emitter layer remote from said cathode emitter layer; at least one auxiliary electrode disposed in ohmic contact with said cathode base layer and spaced away from said cathode electrode; a semiconductor diode including one semiconductor layer disposed on that portion of said cathode base layer located between said cathode emitter layer and said auxiliary emitter layer and spaced away from said at least one auxiliary electrode; said one semiconductor layer being opposite in conductivity to said cathode base layer to form a PN junction therebetween; another electrode disposed in ohmic contact with said semiconductor layer; and means for electrically connecting said another electrode to said gate electrode.

2. A PNPN semiconductor device as claimed in claim 1 wherein said at least one auxiliary electrode is electrically connected to said auxiliary emitter electrode.

3. A PNPN semiconductor device as claimed in claim 1 wherein said diode is located between said auxiliary electrode and said auxiliary emitter electrode.

4. A PNPN semiconductor device as claimed in claim 1 wherein said diode is located between said auxiliary electrode and said cathode electrode.

5. A PNPN semiconductor device as claimed in claim 1 wherein at least two of said auxiliary electrodes are disposed in ohmic contact with said cathode base layer and said diode is located between said two of auxiliary electrodes.

6. A PNPN semiconductor device as claimed in claim 5 wherein said two auxiliary electrodes are electrically interconnected.

7. A PNPN semiconductor device comprising a PNPN semiconductor substrate having a pair of opposite main faces and including a cathode emitter layer and an auxiliary emitter layer identical in conductivity to each other, and disposed on one of said main faces and spaced away from each other, a cathode base layer disposed adjacent said cathode emitter layer on the one main face and an anode emitter layer disposed on the other main face and an anode base layer interposed between said cathode base layer and said anode emitter layer, said anode emitter layer being opposite in conductivity to said anode base layer; an anode electrode disposed in ohmic contact with both said anode emitter layer and said anode base layer to electrically shortcircuit both of said layers; a cathode electrode disposed in ohmic contact with said cathode emitter layer; an auxiliary emitter electrode disposed in ohmic contact with said auxiliary emitter layer; a gate electrode disposed in ohmic contact with that portion of said cathode base layer disposed on that side of said auxiliary emitter layer remote from said cathode emitter layer; at least one auxiliary electrode disposed in ohmic contact with said cathode base layer and spaced away from said cathode electrode; a semiconductor diode including one semiconductor layer disposed on that portion of said cathode base layer located between said cathode emitter lyer and said auxiliary emitter layer and spaced away from said at least one auxiliary electrode; said one semiconductor layer being opposite in conductivity to said cathode base layer to form a PN junction therebetween; another electrode disposed in ohmic contact with said semiconductor layer; and means for electrically connecting said another electrode to said gate electrode.

8. A PNPN semiconductor device as claimed in claim 7 wherein said at least one auxiliary electrode is electrically connected to said auxiliary emitter electrode.

* * * * *